United States Patent [19]

Bruckert et al.

[11] 4,301,444
[45] Nov. 17, 1981

[54] APPARATUS FOR DETECTING POSSIBLE DEFEAT OF SYSTEMS FOR REMOTE METERING OF UTILITIES

[75] Inventors: Eugene J. Bruckert, Arlington Heights; Morgan H. Cooper, Crystal Lake, both of Ill.

[73] Assignee: Motorola, Inc., Schaumburg, Ill.

[21] Appl. No.: 86,544

[22] Filed: Oct. 19, 1979

[51] Int. Cl.³ .............................................. H04Q 9/00
[52] U.S. Cl. .......................... 340/870.02; 235/92 FP; 340/825.15; 340/825.35; 340/825.54
[58] Field of Search .................. 340/151, 152, 147 R, 340/147; 364/550, 483; 239/92 FP

[56] References Cited

U.S. PATENT DOCUMENTS

| | | | |
|---|---|---|---|
| 3,748,444 | 7/1973 | Gilboy et al. | 235/92 FP |
| 4,064,485 | 12/1977 | Leyde | 340/147 R |
| 4,167,786 | 9/1979 | Miller et al. | 340/150 |
| 4,201,907 | 5/1980 | Otten | 340/151 |
| 4,204,194 | 5/1980 | Bogacki | 340/151 |
| 4,216,461 | 8/1980 | Werth et al. | 340/150 |
| 4,218,737 | 8/1980 | Buscher et al. | 340/151 |

*Primary Examiner*—Donald J. Yusko
*Attorney, Agent, or Firm*—Donald P. Reynolds; Edward M. Roney; James W. Gillman

[57] ABSTRACT

In remotely readable utility metering systems of the type including a plurality of rates and apparatus for indicating the amount of the utility consumed at each rate and shed controlled appliances with shed commands and rate change commands being issued from a remote central reading station, apparatus and method for monitoring the metering of the utility which includes monitoring a variety of events, e.g., counting the number of rate change and/or shed commands received by the metering system, to determine whether the metering system is operating correctly.

11 Claims, 2 Drawing Figures

APPARATUS FOR DETECTING POSSIBLE DEFEAT OF SYSTEMS FOR REMOTE METERING OF UTILITIES

BACKGROUND OF THE INVENTION

At the present time, the price of utilities, such as electric power, is affected by not only the amount of the utility consumed but also by the time at which the utility is consumed. The utility companies are beginning to charge large industrial clients different rates for consumption at different times of the day, and are presently considering various apparatus for allowing similar types of charges to individual homes. A great number and variety of apparatus has been patented, and otherwise proposed, for remotely readable, automatic utility metering systems. In general, these metering systems utilize telephone lines or radio communications for receiving commands and sending information to a remotely located central reading station. A typical remote reading system utilizing a telephone connection with the central reading station is disclosed in U.S. Pat. No. 4,008,458, issued Feb. 15, 1977, entitled "Remote Automatic Reading System". A typical radio communication system will be described presently in conjunction with FIG. 1.

Theft of utilities, and especially electric power, is a major problem of the utility industry today and estimates indicate that the theft burden can be expected to increase geometrically. With the advent of the new remotely readable metering systems many types of methods and apparatus are being devised to defeat the metering systems. For example, in radio communications systems signals can be blocked from the receiver so that commands changing the rates are not received. Further, meters can be removed and installed backwards and the meters can be simply disconnected periodically. The only techniques available today to prevent theft are on-site inspection and statistical billing surveys.

A technique for controlling the amount of power consumption, especially during peak use periods, has been developed wherein high power consuming appliances of a consumer are turned off for short periods of time to reduce the load on the utility company. Turning off the appliance is referred to as "shedding" and the period during which the appliance is turned off is referred to as the shed "mode" or "condition" and the appliance is "restored" at the end of the shed mode. Apparatus for shedding appliances to maintain an individual's consumption below a predetermined value are disclosed in a number of patents, but this type of shedding is generally not the type referred to herein. Shedding can also be accomplished by the utility company through shed commands transmitted by the central reading station. If an individual agrees to allow the utility company to practice this technique in his home, shed controls are attached to one or more of his major appliances, which controls are in some manner remotely operated by the utility company. In return for allowing this technique to be practiced, the individual generally receives some reduction in his billing. Assuming that all of the shed controls are working properly the utility company can substantially reduce its peak load during high use periods by alternately shedding, for example, the air conditioners of a first ten percent of its clients for five minutes and the air conditioners of a second ten percent of its clients for five minutes, etc. In this fashion the utility company substantially reduces its load and no client loses his air conditioner for more than five minutes every fifty minutes. However, if clients defeat the appliance shed control after agreeing to allow it to be installed, the shedding technique does not operate properly and power is being misappropriated from the utility company.

SUMMARY OF THE INVENTION

The present invention pertains to apparatus and methods for monitoring the metering of utilities in remotely readable, automatic utility metering systems and includes the monitoring of events, generally through the use of event registers, to provide a periodic indication of the system operation. The events monitored will generally include the number of shed commands received and the number of rate change commands received. Indications as to whether appliances are actually shed may also be monitored as well as the amount of time during which power is not being applied to the meter. By comparing these counts to the actual number available at the central reading station, an indication as to the system operation is obtained.

It is an object of the present invention to provide apparatus and methods for monitoring the metering of utilities in a remotely readable, automatic utility metering system.

It is a further object of the present invention to provide apparatus for monitoring the metering of utilities, which apparatus is included in a remotely readable, automatic utility metering system and, therefore, is relatively inexpensive and simple to manufacture and operate.

These and other objects of this invention will become apparent to those skilled in the art upon consideration of the accompanying specification, claims and drawings.

BRIEF DESCRIPTION OF THE DRAWINGS

Referring to the drawings

DESCRIPTION OF THE PREFERRED EMBODIMENT

Figure 1:
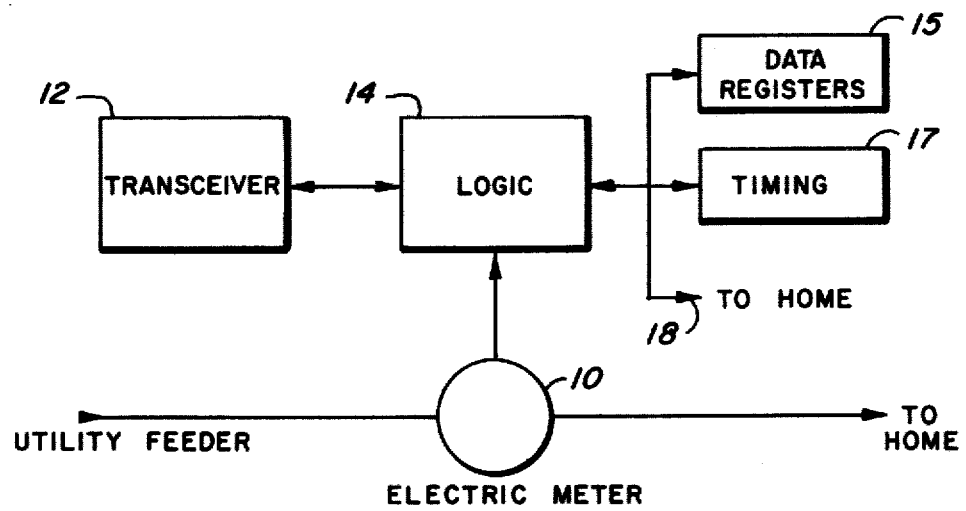
FIG. 1 is a simplified block diagram of a remotely readable, automatic utility metering system utilizing radio communications.

A typical-time-of use utility metering system is illustrated in FIG. 1. In the utility metering system of FIG. 1 electric power is being supplied from a utility feeder through an electric meter 10 to a home, but it should be understood that the system might be used equally well for any of the other utilities, e.g., water and gas. The time of use portion of the metering system is illustrated in simplified block form and includes a transceiver 12 connected to a logic unit 14, which is also connected to receive from the meter 10 pulses indicative of the amount of electricity used, with the logic unit 14 being further connected to data registers 15, timing circuit 17 and to the house through a terminal 18. The transceiver 12 communicates with a central reading station to provide power usage information thereto and receive rate and shed commands. The logic unit 14 is any convenient logic circuitry, including IC's and the like, connected to control the transceiver and to connect the electric meter 10 to the correct data registers in response to received commands. Typically, the data registers 15 may include as many as three different rate registers, one being for power used during the normal rate, one being for power used during a high rate and one being for power used during a super high rate. During high usage periods the central reading station will send a command through the transceiver 12 which will cause the logic unit 14 to switch pulses from the electric meter 10 to the high rate register in the data registers 15. During peak power periods (e.g. 5:00 p.m. to 7:00 p.m.) a command will switch the meter 10 to a super high rate register in the data registers 15. More or fewer rate categories may be utilized, depending upon the community being serviced and the equipment providing the power. In an urban community, where a large percentage of the people leave work at the same time, a high power usage occurs at quitting time and, if the power company does not have sufficient generating capacity to supply the power it may have to buy power from a neighboring utility company, which can greatly increase the rate. Thus, the three registers in the data registers 15 record the amount of power used during each of the three periods and, when a read command is received by the transceiver 12 the logic unit 14 causes the information in the data registers 15 to be encoded and transmitted to the central reading station by way of the transceiver 12. The encoding can be any of the many systems known to those skilled in the art, such as pulse coding and/or frequency coding. A typical multifrequency system which could be utilized in this type of system is disclosed in U.S. Pat. No. 4,091,243, issued May 23, 1978 and entitled "Multi-Frequency Signal Receiver".

The timing circuit 17 of FIG. 1 is simply utilized in conjunction with the logic unit 14 to ensure correct operation of the various circuits at the correct time in conjunction with pulses from the meter 10. The terminal 18 to the house is connected to various appliances having shed controls attached thereto. When a home is on the shed control program commands will be transmitted from the central reading station during peak power periods, which commands will be received by the transceiver 12 and processed by the logic unit 14. If more than one appliance is in the shed control program the logic unit 14 will separate the commands, in accordance with pulse or frequency coding, and direct the commands to the correct appliance for shedding that appliance. Appliance shed controls are commercially available and a typical control is manufactured by Motorola, Inc. under the number 800W.

Figure 2:
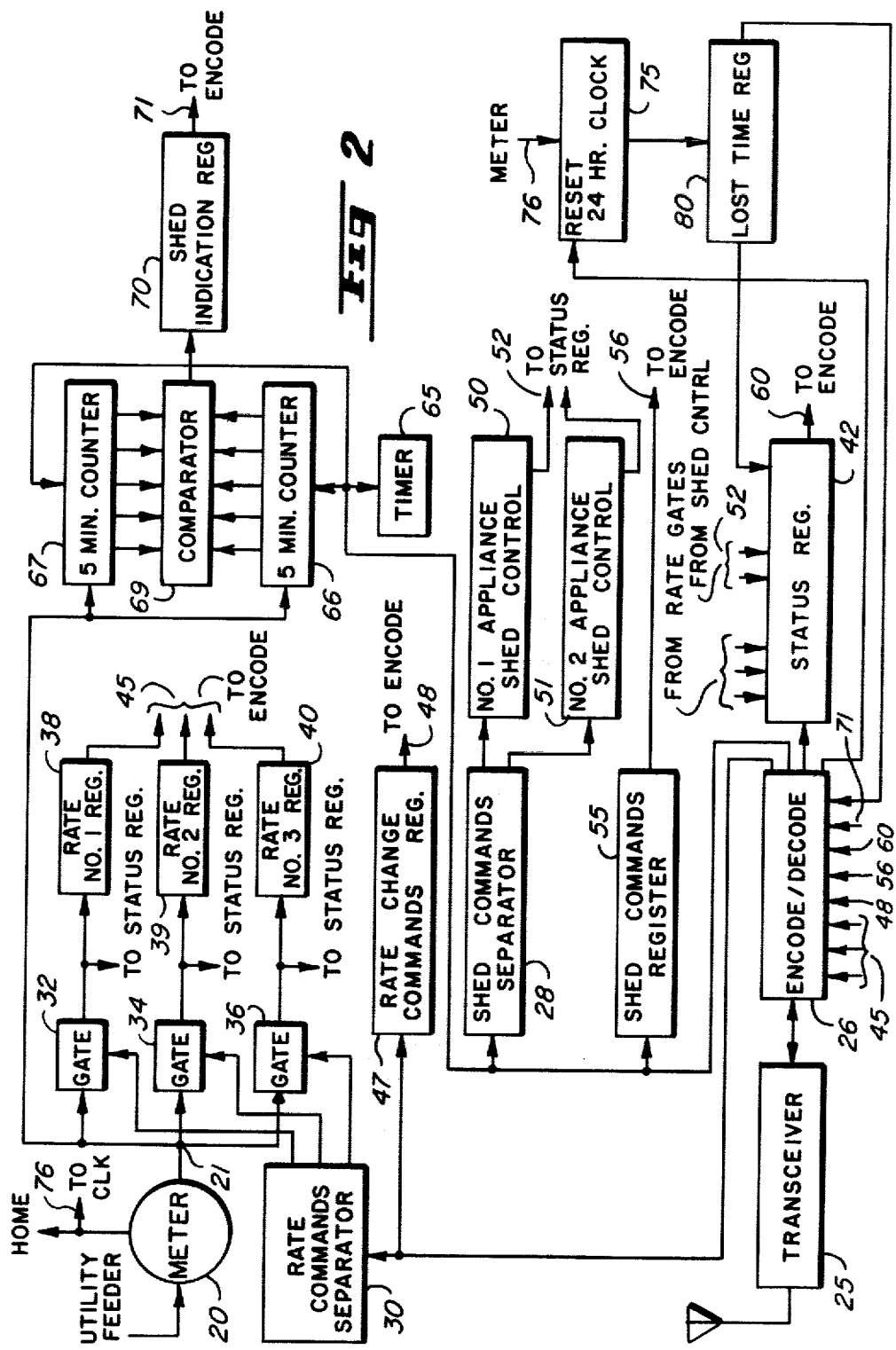
Fig. 2 is a simplified block diagram of a system similar to FIG. 1 and including apparatus for monitoring the metering of the utility embodying the present invention.

It can readily be seen that reliability of the metering system, as well as theft of power, is a substantial concern. Referring to FIG. 2, a somewhat more elaborate block diagram of the apparatus of FIG. 1 is illustrated, which block diagram includes apparatus for monitoring the metering of the utility and improving the reliability. A study of the monitored information shows the presence of any anomalies that may indicate the theft of electric power due to tampering with the meter or other such means or that may indicate improper operation of the metering system, such as equipment malfunction or a breakdown in the communication link. In this embodiment a utility feeder is connected through a meter 20 to the home with the pulses from the meter, indicative of power consumption, being connected to a terminal 21. A transceiver 25 is connected to an encode/decode unit 26 which is in turn connected to a shed commands separator 28 and a rate commands separator 30. The rate commands separator 30 is connected to three transmission gates 32, 34 and 36. The encode/decode unit 26, the shed and rate commands separators 28 and 30 and the transmission gates 32, 34 and 36 form the major portion of the logic unit. The gates 32, 34 and 36 connect the pulse output terminal 21 of the meter 20 to either a rate number 1 register 38, a rate number 2 register 39 or a rate number 3 register 40, as previously described. The output of each of the gates 32, 34 and 36 are also connected to a status register 42, which maintains a continuous record of the rate being recorded in the metering system. Outputs of each of the registers 38, 39 and 40, designated 45, are connected to the encode/decode unit 26 for providing encoded power consumption information to the transceiver 25. While separate blocks are illustrated for the shed commands separator 28, the rate commands separator 30 and the encode/decode unit 26, it will be understood by those skilled in the art that the various commands may be automatically separated in the decode process and the several blocks are illustrated for convenience in understanding the disclosure.

In addition to sending rate commands to the separator 30, the encode/decode unit 26 sends each rate change command to a register 47 for recording. The output of the register 47, designated 48, is connected to the encode/decode unit 26 for encoding and transmission to the central reading station. The shed commands separator 28 is connected to number 1 and 2 appliance shed controls 50 and 51, which operate as previously described, each of which has an output, designated 52, connected to the status register 42. The outputs 52 of the appliance shed controls 50 and 51 provide a continuous indication of whether the number 1 and number 2 appliances are in the shed mode or in the standard operating mode. Shed commands conveyed to the separator 28 by the encode/decode unit 26 are also conveyed to a shed commands register 55 which keeps a record of all shed commands communicated to the metering system by the central reading station. An output 56 of the shed commands register 55 is connected to the encode/decode unit 26 for encoding and transmission to the central reading station. The status register 42 has an output 60 connected to the encode/decode unit 26 for encoding and transmission of the status information to the central reading station.

Shed commands from the encode/decode unit 26 and outputs from a timer 65 are applied to two 5 minute counters 66 and 67 to control counting operations thereof. Output pulses from the meter 20, available at the terminal 21, are supplied to the inputs of the counters 66 and 67 and are counted during operating modes thereof. Parallel outputs of the counters 66 and 67 are supplied to a comparator 69 and the output thereof is connected to a shed indications register 70. The output of the register 70, designated 71, is connected to the encode/decode unit 26. While the shed commands register 55 counts the number of shed commands received by the metering system, the shed indications register 70 counts the number of sheds that actually occur. The sheddable appliances (connected to shed controls 50 and 51) consume multiple kilowatts when on, and, in a shed situation the appliances are very likely to turn on after release of the shed control, whereas turn off may have low probability. Also, it is easier to measure the turn on condition for the appliances. Thus, when in a shed mode, as determined by the shed command from the encode/decode unit 26, a moving five minute count of meter pulses is made via the counter 66. At the end of the shed mode a release pulse is generated. The last minute's time, as determined by the timer 65, is completed before control of the appliance and the counter 66 is released. The count in counter 66 constitutes the energy consumed during shed. The timer 65 then enables the counter 67 for a five minute count of the pulses from meter 20. The counter 67 then contains an indication of the energy consumed after the load has been restored. If the count in counter 67 is greater than the count in counter 66 by a preselected threshold, as determined by the comparator 69, the count in register 70 is increased by one count. While specific counting times are suggested and specific circuitry is utilized herein for determining shed indications, it will be understood by those skilled in the art that other times and apparatus might be utilized to perform this function.

A twenty-four hour clock is included to provide an indication of lost time. Lost time is time during which the meter 20 is not supplying power to the home. The duration of power outages may be of interest to the utility company, especially if there has been no utility equipment failure. The twenty-four hour clock 75 may be crystal controlled and receives power from a terminal 76 at the output of the meter 20. Thus, whenever meter 20 is disconnected or power is otherwise not supplied to the home the terminal 76 is deenergized and the twenty-four hour clock 75 stops operating until power is again received. The clock 75 is reset once a day at a convenient time, for example midnight, by receipt of a reset signal from the central reading station via the transceiver 25 and encode/decode unit 26. The reset signal includes a calibration signal so that the difference between the reading in the clock 75 and the actual time that it should read is supplied to a lost time register 80. The lost time register 80 sums and stores all of the lost time for periods between reading or interrogation of the metering system. An output of the lost time register 80 is supplied to the encode/decode unit 26 so that the sum of the lost time can be encoded and transmitted to the central reading station. An output of the register 80 is also connected to the status register 42 and provides a simple status type output (lost time or no lost time) to the register 42. The status register 42 enables the utility company to perform a real time check of the status of each metering system at any time between power consumption readings.

Thus, in response to commands from the central reading station, which may be transmitted daily, weekly, or at any desired interval, the metering system not only provides information as to the amount of energy consumed and when the energy was consumed, but also provides a count of the number of rate change commands received, the number of shed commands received, the number of sheds actually performed and the amount of time power was removed from the meter for any reason. Also, at any time during the day the central reading station can command the metering system to provide the instantaneous status thereof, i.e., the present rate, the present shed activity, and whether time has been lost or not. A brief review of this information, manually or through a preprogrammed computer at the central reading station, will quickly detect any improper operation of the metering system. While five different registers are provided for storing the number of occurrences of events which affect the proper operation of the metering system, those skilled in the art may be directed towards other and/or additional events which may also be useful for indicating the proper operation of the metering system and it is intended that the monitoring of all such events be encompassed herein. Thus, new and improved apparatus for controlling the theft of a utility and for maintaining a higher standard of system reliability is disclosed.

While we have shown and described a specifc embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. In a remotely readable, automatic utility metering system of the type including a plurality of rates and apparatus for indicating the amount of the utility consumed at each rate, and shed controlled appliances with shed commands and rate change commands being issued from a remote central reading station, apparatus for monitoring the metering of the utility comprising a plurality of event registers each connected for storing the number of occurrences of a different event in a predetermined period of time and means for determining the stored number of occurrences at the central reading station.

2. Apparatus as claimed in claim 1 wherein the plurality of event registers include a register for storing the number of rate change commands received by the metering system.

3. Apparatus as claimed in claim 2 wherein the plurality of event registers include a register for storing the number of shed commands received by the metering system.

4. Apparatus as claimed in claim 1 including in addition a timer, first and second counters, a comparator and a register connected for measuring the amount of utility consumed for a predetermined period during and after a shed mode and providing a count to the register each time the measured amount increases a predetermined amount after the shed mode.

5. Apparatus as claimed in claim 1 including in addition a fixed time clock connected to be powered by the utility and resettable from the central reading station at a predetermined time, and a register connected to said clock for storing any time remaining on said clock at the time of reset.

6. Apparatus as claimed in claim 1 wherein the plurality of event registers include a status register connected to store the instantaneous status of the usage rate at which the utility is being consumed and the shed controlled appliances.

7. In a remotely readable, automatic utility metering system of the type including a plurality of rates and apparatus for indicating the amount of the utility consumed at each rate, and shed controlled appliances with shed commands and rate change commands being issued from a remote central reading station, apparatus for monitoring the metering of the utility comprising:
(a) a first register connected to receive the rate change commands and store the number of rate change commands received;
(b) a second register connected to receive the shed commands and store the number of shed commands received;
(c) shed indication means including a timer, first and second counters, a comparator and a shed indication register connected for measuring the amount of the utility consumed for a predetermined period during and after a shed mode and storing a count in the shed indication register each time the measured amount increases a predetermined amount after the shed mode; and (d) means for communicating the stored numbers in the first, second and shed indication registers to the central reading station.

8. In a remotely readable, automatic utility metering system of the type including a plurality of rates and apparatus for indicating the amount of the utility consumed at each rate, and shed controlled appliances with shed commands and rate change commands being issued from a remote central reading station, a method of monitoring the metering of the utility comprising the steps of:

(a) counting the number of shed commands received;
(b) counting the number of rate change commands received; and
(c) comparing the number of shed commands and rate change commands received with the number issued.

9. A method of detecting the possible theft of the utility as claimed in claim 8 including the steps of determining the number of times shed controlled appliances are actually shed and comparing this number of the number of shed commands issued.

10. A method of detecting the possible theft of the utility as claimed in claim 9 wherein the step of determining the number of times shed controlled appliances are actually shed includes the steps of measuring the amount of utility consumed for a predetermined period of time during the shed mode, measuring the amount of utility consumed for the same predetermined period of time after the shed mode, comparing the two measured amounts of power to determine if an appliance was actually turned off during the shed mode and turned on after the shed mode.

11. A method of detecting the possible theft of the utility as claimed in claim 8 including the steps of measuring the length of time the metering system is not receiving the utility and comparing the measured time to known times when the utility was not being supplied to the system.

* * * * *